United States Patent
Kamitani

(10) Patent No.: US 7,405,576 B2
(45) Date of Patent: *Jul. 29, 2008

(54) METHOD AND APPARATUS FOR MEASURING HIGH-FREQUENCY ELECTRICAL CHARACTERISTICS OF ELECTRONIC DEVICE, AND METHOD FOR CALIBRATING APPARATUS FOR MEASURING HIGH-FREQUENCY ELECTRICAL CHARACTERISTICS

(75) Inventor: Gaku Kamitani, Kyoto-fu (JP)

(73) Assignee: Murata Manufacturing Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/537,240

(22) Filed: Sep. 29, 2006

(65) Prior Publication Data

US 2007/0040561 A1 Feb. 22, 2007

Related U.S. Application Data

(63) Continuation of application No. PCT/JP2004/019085, filed on Dec. 21, 2004, and a continuation of application No. PCT/JP2004/004744, filed on Mar. 31, 2004.

(51) Int. Cl.
*G01R 27/28* (2006.01)
*G01R 35/00* (2006.01)
*G01D 18/00* (2006.01)

(52) U.S. Cl. .............. 324/650; 324/649; 324/601; 702/85

(58) Field of Classification Search ........... 324/650, 324/649, 600, 601, 202, 130, 74, 500, 629, 324/637, 638, 615; 702/85, 90, 104, 107, 702/117, 118, 182, 189
See application file for complete search history.

(56) References Cited

U.S. PATENT DOCUMENTS 4,858,160 A * 8/1989 Strid et al. .................. 702/106

(Continued)

FOREIGN PATENT DOCUMENTS

| JP | 6-34686 | 2/1994 |
| JP | 10-197577 | 7/1998 |

OTHER PUBLICATIONS

International Search Report issued Apr. 26, 2005.

(Continued)

*Primary Examiner*—Andrew H Hirshfeld
*Assistant Examiner*—Hoai-An D. Nguyen
(74) *Attorney, Agent, or Firm*—Ostrolenk, Faber, Gerb & Soffen, LLP

(57) ABSTRACT

Two ends of a transmission line whose electrical characteristics per unit length are known are connected to associated measurement ports of a network analyzer. A short standard is shunt-connected to at least three points in the longitudinal direction of the transmission line, and electrical characteristics are measured in a short-circuited state, thereby calculating error factors of a measurement system. Then an electronic device to be measured is shunt-connected to the transmission line, and electrical characteristics of the electronic device are measured. Then the error factors of the measurement system are removed from the measured values of the electronic device to be measured, thereby obtaining true values of the electrical characteristics of the electronic device to be measured. Accordingly, a highly accurate high-frequency electrical characteristic measuring method that is not affected by connection variations can be implemented.

19 Claims, 8 Drawing Sheets

U.S. PATENT DOCUMENTS

| | | | | |
|---|---|---|---|---|
| 5,159,262 | A * | 10/1992 | Rumbaugh et al. | 324/765 |
| 6,838,885 | B2 * | 1/2005 | Kamitani | 324/601 |
| 6,960,920 | B2 * | 11/2005 | Kamitani | 324/601 |
| 2007/0029990 | A1 * | 2/2007 | Kamitani | 324/76.22 |
| 2007/0040561 | A1 * | 2/2007 | Kamitani | 324/601 |

OTHER PUBLICATIONS

"In-Fixture Measurements Using Vector Network Analyzers," Network Analysis pp. 1-32, no date.

Written Opinion, Mar. 29, 2005.

* cited by examiner

METHOD AND APPARATUS FOR MEASURING HIGH-FREQUENCY ELECTRICAL CHARACTERISTICS OF ELECTRONIC DEVICE, AND METHOD FOR CALIBRATING APPARATUS FOR MEASURING HIGH-FREQUENCY ELECTRICAL CHARACTERISTICS

CROSS-REFERENCE TO RELATED APPLICATIONS

This is a continuation of PCT Application Number PCT/JP2004/004744, filed Mar. 31, 2004, and PCT Application Number PCT/JP2004/019085, filed Dec. 21, 2004, the disclosures of which are hereby incorporated by reference.

BACKGROUND OF THE INVENTION

1. Technical Field

The present invention relates to a method and apparatus for measuring high-frequency electrical characteristics of a two-terminal electronic device, such as a chip inductor, a chip capacitor, a chip resistor, or the like. More specifically, the present invention relates to a method for correcting a measurement error in measuring the impedance or the Q-value of the two-terminal electronic device with a shunt method using a measuring device, such as a network analyzer or the like.

2. Related Art

To measure high-frequency electrical characteristics of an impedance device, such as a surface-mounted chip inductor or a surface-mounted chip capacitor, using a network analyzer, since it is impossible to directly connect coaxial cables to the electronic device, there is a measurement method in which a planar transmission line (such as a microstrip line or a coplanar waveguide) is interposed between the electronic device and coaxial cables or the like connected to the network analyzer, and the electronic device is brought into contact with the planar transmission line to make a measurement. In this case, in order to obtain true values of a scattering parameter matrix of the impedance device serving as a test object, it is necessary to identify error factors of a measurement system and to remove the effects of the error factors from the measurement results. This is referred to as correction or calibration.

In the measurement using a network analyzer, as shown in Application Note 1287-9; In-Fixture Measurements Using Vector Network Analyzers (©1999 Hewlett-Packard Company) (non-patent document 1), TRL (Through-Reflection-Load) calibration and SOLT (Short-Open-Load-Through) calibration are known techniques for removing errors of the measurement system.

FIGS. 1 and 2 show, respectively, a measurement systems using a network analyzer and corresponding error models for use in SOLT calibration and TRL calibration.

An electronic device 1 serving as a test object is connected to a transmission line provided on the top surface of a measuring fixture 2. Two ends of the transmission line on the measuring fixture 2 are connected to measurement ports of the network analyzer, which is not shown, via coaxial cables 3.

In the error model of SOLT calibration, $S_{11A}$, $S_{12A}$, $S_{21A}$ and $S_{22A}$ are scattering parameters of the transmission line including the test object, $E_{DF}$, $E_{RF}$, and $E_{SF}$ are scattering parameters on one measurement port side, and $E_{LF}$ and $E_{TF}$ are scattering parameters on the other measurement port side.

In the error model of TRL calibration, $S_{11A}$, $S_{12A}$, $S_{21A}$ and to $S_{22A}$ are scattering parameters of the test object, $e_{00}$, $e_{01}$, $e_{10}$, and $e_{11}$ are scattering parameters on one measurement port side, and $f_{00}$, $f_{00}$, $f_{01}$, $f_{10}$ and $f_{11}$ are scattering parameters on the other measurement port side.

In order to identify error factors, it is necessary to fix at least three types of devices ("standards") whose scattering parameters are known to a test object measuring plane and make measurements. Traditionally, opens, shorts, and terminations (=50Ω) are often used. Since these standards can be implemented in a coaxial environment, this method, which is referred to as SOLT calibration, is widely used. In SOLT calibration, as shown in FIG. 3, three types of connectors 4 including a short (0Ω), an open (∞Ω), and a termination (load)(50Ω) are used, and also the ports are directly connected to each other to achieve a through state.

However, in the case of SOLT calibration, it is very difficult to implement these standards in environments other than the coaxial environment, and the standards necessary for calibration cannot be fabricated in the form of a chip device. For example, a planar transmission line for use in measuring a surface-mounted device is, unlike a waveguide or a coaxial transmission line, unable to achieve a satisfactory "open" or "termination", and it is thereby practically impossible to perform SOLT calibration. Also, in general, measured values obtained by measurements are not characteristics of the test object 1 alone, but are composite characteristics of the test object 1 and the measuring fixture 2 to which the test object is connected. It is thus impossible to measure characteristics of the test object alone.

TRL calibration employs, as shown in FIG. 4, instead of device-shaped standards that are difficult to realize, a (through) transmission line 5a whose ports are directly connected to each other, a total reflection (reflection=normally shorted) transmission line 5b, and a few types of transmission lines 5c and 5d of different lengths as standards. With regard to the transmission lines 5a to 5d, it is relatively easy to fabricate transmission lines whose scattering parameters are known. Also, if the total reflection is achieved by shorting, it is relatively easy to estimate characteristics thereof. Therefore, only these transmission lines are necessary to perform calibration. Basically, it is possible to measure the characteristics of the test object 1 alone.

In this example, the through transmission line 5a is a so-called non-zero-through. The test object 1 is shunt-connected to a central portion of the through transmission line 5a, and a measurement is made.

However, when TRL calibration is applied to a surface-mounted device serving as a test object, the following problems occur.

1) With regard to the transmission lines (the various types of lines, including reflection and through lines) 5a to 5d serving as the standards, it is necessary that all the error factors generated in connections between coaxial cables 3 and the transmission lines 5a to 5d be equivalent. However, even when the same type of connectors are used on the standards, characteristics of the standards vary greatly when the standards are connected to a measuring device, thereby generating calibration errors. It is practically impossible to perform TRL calibration near a millimeter-wave band.

2) In order to solve this problem, the same coaxial connectors are used in common among the transmission lines 5a to 5d, and coaxial pins are in contact and connected to the transmission lines serving as the standards, thereby avoiding the effects of variations in connections with the connectors. Structurally, however, it is difficult to ensure a sufficient pressing load at the connections, and hence the coaxial pins may be damaged. Since the connections are unstable, calibration becomes also often unstable. The higher the measurement frequency, generally the thinner the transmission lines and the coaxial pins. Depending on the positioning repeatability thereof, measurement variations may become larger.

3) Since it is difficult to determine, in the calibration operation, whether the measurement is properly performed in the calibration, there may be a waste of time, such as a failure, e.g., poor contact at the time of the calibration, recognized upon a measurement of a test object after having completed the time-consuming calibration operation.

Patent document 1 discloses a method for calibrating a network analyzer having two test terminals to be connected to a test object via a strip line. That is, a first calibration measurement is made to measure transmission and reflection parameters of the microstrip line whose propagation constant is unknown, which is connected between the two test terminals in a reflection-free manner. Three further calibration measurements are made using the same line and three calibration standards realized with reflection-symmetric and reciprocal discontinuous objects disposed at three different positions on the line.

That is, the three types of standards are realized by changing the state of the transmission line to three states. This way, the standards are connected only once. With this method, compared with TRL calibration, the number of times the standards are connected is reduced, and hence measurement errors in the calibration operation are reduced in number.

However, in the actual measurement of a test object, it is necessary to remove the strip line employed as the standard, and to again connect a strip line (fixture) to which the test object can be connected. Needless to say, characteristics of a reconnected portion change, resulting in measurement errors.

It is practically difficult to connect the strip line between the two test terminals in a reflection-free manner. Reflection parameters of portions in which the test terminals are connected to the strip line may cause errors.

Measured values obtained by connecting a test object are not characteristics of the test object alone, but are composite characteristics of the test object and the strip line to which the test object is connected. It is thus impossible to measure the characteristics of the test object alone.

SUMMARY OF THE INVENTION

The present invention improves upon TRL calibration and SOLT calibration techniques and provides a highly accurate method for measuring high-frequency electrical characteristics of an electronic device, which is not affected by characteristic variations in connections.

The present invention further provides a highly accurate apparatus for measuring high-frequency electrical characteristics of an electronic device.

The present invention also provides a highly accurate method for calibrating a high-frequency electrical characteristic measuring apparatus.

Accordingly, the invention provides a method for measuring high-frequency characteristics of an electronic device. The method includes a step of preparing a transmission line whose electrical characteristics per unit length are known, the transmission line including a signal conductor and a ground conductor; a step of connecting two ends of the transmission line to associated measurement ports of a measuring device; a step of measuring, at least three points in the longitudinal direction of the transmission line, electrical characteristics in a connection state where the signal conductor is connected to the ground conductor; a step of obtaining error factors of a measurement system including the transmission line on the basis of measured values in the connection state and the electrical characteristics of the transmission line; a step of shunt-connecting the electronic device to be measured to the transmission line and measuring electrical characteristics; and a step of removing the error factors of the measurement system from measured values of the electronic device to be measured and obtaining true values of the electrical characteristics of the electronic device to be measured.

The present invention provides a technique for removing errors of a measurement system including the transmission line and the like, including a so-called shunt method including shunt-connecting a test object between a signal conductor and a ground conductor of a transmission line serving as a measuring fixture, measuring reflection parameters and transmission parameters of this portion, and obtaining electrical characteristics such as the impedance or the like on the basis of the measured values The present invention is based on the knowledge that, in the measurement of errors of the measurement system, it is easy to achieve a satisfactory short-circuited state of the transmission line.

In a preferred example of the calibration method according to the present invention (hereinafter referred to as TRRR calibration), a short standard is employed as a calibration standard ("standard"). This is because, since a short-circuited state is substantially equivalent to a total reflection state, the effects of a port opposite to a port being measured can be avoided. In the frequency range where the transmission line serving as an object operates in TEM single mode, characteristics in the short-circuited state are substantially not affected by a dielectric, and it is possible to estimate electrical characteristics of the transmission line with high accuracy using an electromagnetic field simulation.

In general, a parameter that limits the accuracy of simulated transmission line characteristics is a dielectric constant. It has been confirmed that there is only a negligible change in the calculation results of the reflection characteristics in a short-circuited state when the dielectric constant is changed. It can be said that there is no harm in assuming that the simulation results are physical true values to be used in calibration. When the width of the transmission line is sufficiently smaller than the wavelength of a measured signal, it can be regarded that no big error will be introduced by using −1 (reflection parameter of an ideal short) as a short characteristic.

The outline of TRRR calibration according to the preferred example will now be described.

Calibration Step 1: Measurement in Short-Circuited State

In TRRR calibration, a short standard for shorting the signal conductor and the ground conductor of the transmission line is successively connected to at least three points on the transmission line, thereby serving as a calibration standard. For example, the short standard is connected to a test object measurement position, and a measurement is made. Next, the short standard is connected to a point away from the test object measurement position by $L_1$, and a measurement is made. Further, the short standard is connected to a point away from the test object measurement position by $L_2$, and a measurement is made. If the characteristics of the transmission line are unknown, a further measurement is made at another point.

The short standard refers to electrically shorted devices in general. The short standard is not limited to chip devices and includes metal pieces or tools. Preferably, the short standard has a short-length of contact in the longitudinal direction of the transmission line, as in the edge of a knife. If the short standard is ideal, the reflection parameter is −1 (total reflection). In reality, however, the short standard has a certain amount of inductance, and it is thus necessary that the inductance be known. In a microwave band, compared with an open state, it is generally relatively easy to achieve an almost ideal short-circuited state. If high measurement accuracy is required, the inductance of the short standard shall be obtained with a simple simulation or the like.

Calibration Step 2: Measurement in Through State

After the measurement in the short-circuited state, characteristics of the transmission line are measured in a state (through state) where no device is connected. Error coefficients in the through state can be derived from transmission parameters in an ideal through state and the measured values of the reflection parameters.

If the transfer functions of the measurement system have no directivity (for example, if calibration is performed at the tips of the coaxial cables to remove the directivity of the measuring device), the transfer function in the forward direction and the transfer function in the reverse direction of the error factors become equivalent to each other due to the reciprocity theorem. Thus, the error factors can be calculated on the basis of only the measurement in the short-circuited state, and the measurement in the through state can be omitted.

Measurement Step: Measurement of Test Object

A test object is connected (shunt-connected) to a predetermined position on the transmission line so as to be extended between the signal conductor and the ground conductor, and electrical characteristics of the test object are measured.

Using the measured electrical characteristics of the test object and the error factors obtained in calibration steps 1 and 2, true values of the electrical characteristics of the test object can be calculated.

In the above description, the signal conductor and the ground conductor are shorted in the calibration step. However, it is not always necessary to short the signal conductor and the ground conductor. It is only necessary that the signal conductor be connected to the ground conductor so as to achieve some sort of a reflection state.

For example, if a calibration standard such as a chip resistor is used instead of the short standard, part of a signal entering one port passes through a portion in contact with the device, reaches the other port, is partially reflected at the other port, and returns. However, the level of the returning signal is very small. For example, if it is assumed that 50% (−6 dB) of the input signal passes through the portion in contact with the device, reaches the other port, and is reflected at the other port (the generally estimated reflection level is between −15 dB and −25 dB, and let the average level be −20 dB), the level is about −32 dB (=−6−20−6) in a round trip, and the error level is about 2.5% of the input signal. Thus, the error is very small, and accuracy required for calibration can be achieved.

The TRRR calibration implemented in the above-described manner has the following features.

(1) Calibration and measurement are performed on one and the same transmission line.

In TRL calibration, transmission lines of different lengths serving as standards are necessary, and it is also necessary that connections between the transmission lines and coaxial cables have equivalent electrical characteristics. However, in TRRR calibration, one and the same transmission line is employed not only in calibration, but also in measurement. It is thus unnecessary to reconnect the transmission line, and TRRR calibration is not affected by variations in characteristics of the transmission line, the connectors, and the connections.

(2) The test object is shunt-connected to the transmission line, and a measurement is made.

The transmission line serving as the measuring fixture is structured so as to allow the test object to be connected to the ground conductor and the signal conductor at the same time. For example, a planar transmission line, such as a coplanar waveguide (CPW) or a slot line can be used. TRRR calibration is applicable to the measurement of a two-terminal device using a shunt method. Because the shunt method is employed, the accuracy of measuring a low impedance is high.

Since the transmission line is continuous in TRRR calibration, the calibration standard can be connected to a measurement point in directions of the two ports. Therefore, the range of positions to which the calibration standard is connected becomes large. Because calibration data for the two ports can be obtained by connecting the calibration standard once, the number of times the calibration standard is connected can be reduced.

(3) The length of the transmission line necessary for calibration is determined by the lower limit of frequencies to be measured. In order to handle low frequencies, a long transmission line is necessary. Although it is difficult to handle low frequencies below 100 MHz, TRRR calibration is effective in the measurement at frequencies higher than 100 MHz.

(4) Measurements for calibration are made by shunt-connecting the calibration standard to at least three points on the transmission line.

The number of points at which the measurement of the calibration standard is performed and how far they are away from the test object measurement position are determined by the measurement frequency bandwidth and the upper frequency limit. If the frequency bandwidth is broad, the number of measurement points must be increased. Since it is not necessary to prepare many standards, as in TRL calibration, TRRR calibration can be implemented at low cost.

(5) When the measurement using the calibration standard is performed at four or more points on the transmission line, the characteristics of the transmission line can also be obtained.

If the characteristics of the transmission line are known, the error factors of the measurement system can be obtained by connecting the calibration standard to three points. If the calibration standard is connected to four or more points, not only the error factors of the measurement system, but also the characteristics of the transmission line (dielectric constant, loss coefficient, etc.) can be obtained. Therefore, even when the dielectric constant or loss coefficient of a dielectric material for use in the transmission line fixture is unknown or even when the characteristics of a dielectric material in each lot vary, the characteristics of the transmission line fixture to be used can be accurately obtained, and highly accurate calibration can be performed without errors.

In general, transmission line fixtures made of a base material such as a fluorocarbon resin or alumina have electrical characteristics that vary only slightly, and it is easy to obtain the physical true values of the electrical characteristics. However, these transmission line fixtures are expensive. In contrast, transmission line fixtures made of a base material including a general resin such as an epoxy resin or the like are inexpensive. However, material characteristics of these transmission line fixtures vary greatly, and the dielectric constant and loss coefficient thereof also vary. In such a case, the calibration standard is connected to four or more points to obtain transmission line characteristics. In this way, the electrical characteristics of a test object can be measured with high accuracy without being affected by variations in the transmission line characteristics.

(6) A failure (poor contact) in the calibration measurement can be detected on the basis of the measurement result of the transmission parameters.

Since calibration is performed by shunt-connecting the calibration standard (e.g., short standard) to the transmission line, a total reflection state is achieved in the case of satisfactory contact, and the signal transmission parameters between the ports become very small. Poor contact can be detected by an increase in the transmission parameters, and a calibration failure can be avoided in advance. Since the calibration standard can be vertically pressed against the transmission line, a sufficient pressing load can be easily ensured, and hence the contact easily becomes stable.

(7) TRRR calibration can be implemented using a network analyzer that has only three receivers.

The error model of TRRR calibration may be the same as that of SOLT calibration. All the error factors can be corrected using a three-receiver network analyzer. That is, compared with TRL calibration requiring a four-receiver network analyzer, an inexpensive network analyzer can be used.

(8) The transmission line can have a longer lifetime.

If the transmission line of the contact portion wears out because of numerous test-object measurements, the test object measurement position can be shifted a little to an unworn portion of the transmission line, where further measurements can be performed. Therefore, the lifetime of the transmission line can be extended. In this case, it is unnecessary to redo calibration, and it is possible to mathematically correct the error factors of the measurement system.

(9) In order to measure the impedance, it is preferable that the characteristic impedance or the like of the transmission line be known.

When it is only necessary to measure scattering parameters with reference to the characteristic impedance of the transmission line, the characteristic impedance of the transmission line need not be known. However, in order to measure the impedance or the like, it is preferable that the characteristic impedance of the transmission line be known. This may be obtained with a known method, such as calculating the impedance with a simulation or by using a value actually measured with a time domain reflectory method, for example.

To short the signal conductor and the ground conductor of the transmission line, the short standard is shunt-connected to the transmission line. However, due to high frequencies, the influence of the residual inductance of the short standard may be great, and the signal conductor and the ground conductor may not be sufficiently shorted (signal passes from one port to the other and the total reflection cannot be achieved).

In this case, it is preferable that the calibration standard be brought near (not in contact with) the transmission line, and the stray capacitance generated between the transmission line and the calibration standard and the residual inductance of the calibration standard be in a series resonance state.

In the series resonance state, the impedance of a portion connected to the calibration standard is $0\Omega$, that is, an ideal short-circuited state is achieved. In other words, even at high frequencies where a satisfactory short-circuited state is not achieved, the same advantage as that of using a satisfactory short standard can be achieved.

This is not limited to the case where the calibration standard is not in contact with the transmission line, and the series resonance state is produced with stray capacitance between the calibration standard and the transmission line. Alternatively, a capacitor with a very small capacitance may be used as the calibration standard, and the capacitor may be brought into contact (completely connected) with the transmission line to produce series resonance.

It is preferable to use, as the measuring fixture for use in the present invention, a measuring fixture with a transmission line including a signal conductor and a ground conductor disposed on the same plane. In this way, when performing calibration using a calibration standard or measurement using a test object, the calibration standard or the test object can be easily brought into contact and electrically connected to the signal conductor and the ground conductor at the same time. Since the calibration standard or the test object can be vertically pressed against the transmission line, a sufficient pressing load can be easily ensured, and hence the contact easily becomes stable.

Specifically, a coplanar waveguide or a slot line may be used as the transmission line. The coplanar waveguide includes, as has been described above, a signal conductor and ground conductors having the signal conductor therebetween. The coplanar waveguide is suitable for the measurement of high-frequency characteristics up to 10 GHz. In contrast, the slot line includes a signal conductor and a ground conductor, which are disposed on the same plane with a space therebetween. The slot line is suitable for the measurement of high-frequency characteristics at 10 GHz or higher.

With regard to the distance between potions at which the calibration standard is shunt-connected, the preferred positions are determined by frequencies to be measured. It is preferable that the phase difference between the positions be between 70° and 145°.

In order to perform highly accurate calibration, it is preferable that pieces of calibration data be apart from each other as far as possible. In TRRR calibration where different pieces of calibration data are obtained depending on the reflection phase based on the calibration standard, preferably, for the sake of calibration, the phase difference between the positions at which the calibration standard is connected is between 70° and 145° in order to enhance the calibration accuracy. When the phase difference between the connection positions is set as described above, the frequency range that can be handled by a pair of calibration standards becomes quite narrow, though the calibration accuracy becomes high. However, when the setting of the positions at which the calibration standard is connected is very easy, and when the measured data in the calibration is put to full use, the number of times the calibration standard is measured is not greatly increased, even in the case of broadband measurement, which thereby presents no practical problem.

If the frequency bandwidth to be measured is broad, it is preferable that the calibration standard be connected to four or more points. When the frequency band becomes broader, some of the positions may be ½ wavelength of a signal or multiples of ½ wavelength. When such data is excluded, data at three points needs to remain.

Other features and advantages of the present invention will become apparent from the following description of embodiments of the invention which refers to the accompanying drawings.

DETAILED DESCRIPTION OF EMBODIMENTS OF THE INVENTION

Hereinafter, TRRR calibration according to the present invention will be illustrated with reference to embodiments.

Embodiment 1

FIGS. 5 to 8 show a first embodiment according to the present invention.

Calibration Standard in TRRR Calibration

In TRRR calibration, a calibration standard to be measured is a short standard 10 in all cases, and a measuring fixture 11 (transmission line 12) to be used is the same fixture in all cases.

Figure 5:
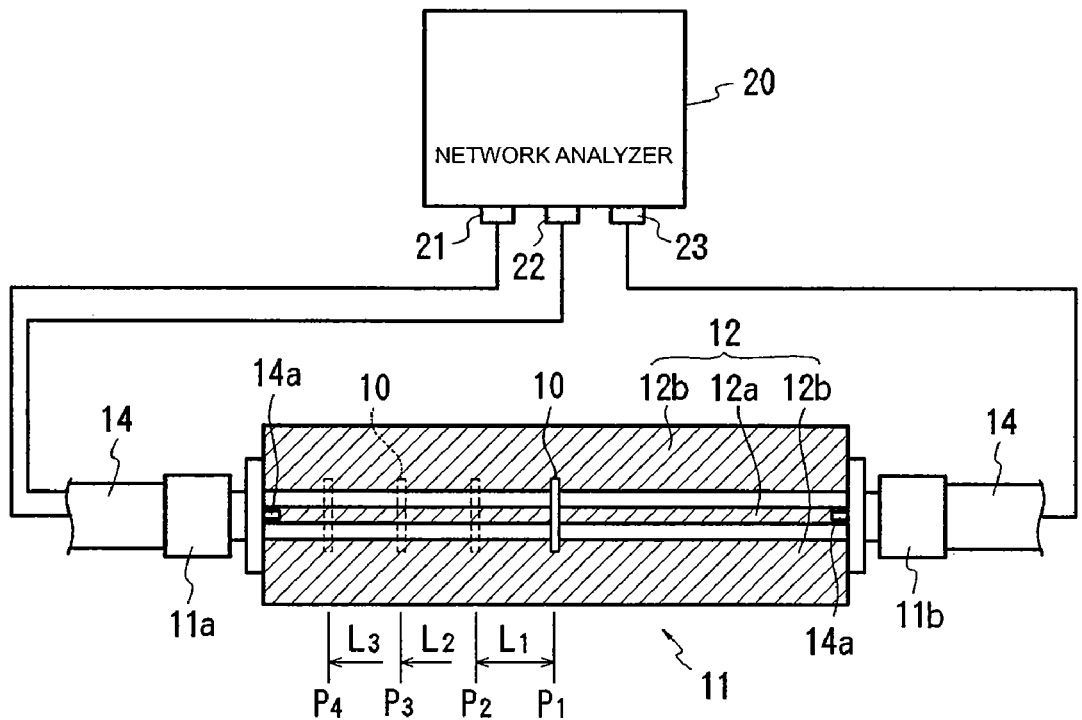
FIG. 5 is a plan view of a high-frequency electrical characteristic measuring apparatus showing TRRR calibration according to an example of the present invention.
Figure 6:
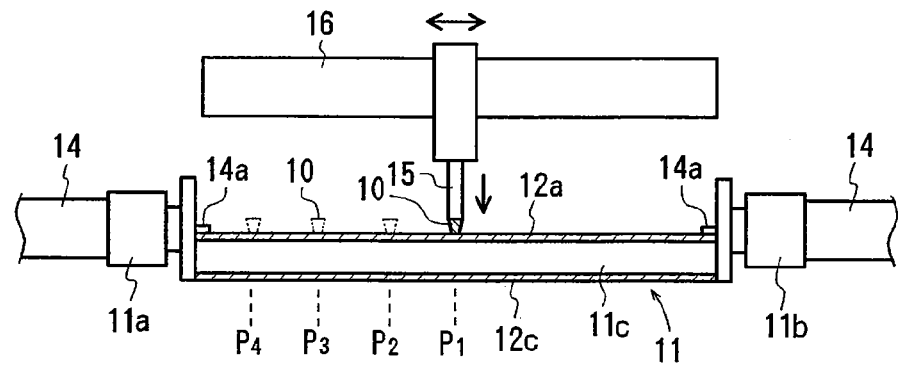
FIG. 6 is a front view of the high-frequency electrical characteristic measuring apparatus in the calibration shown in FIG. 5.

Here, a description is given using a coplanar waveguide serving as the measuring fixture 11 as an example. The measuring fixture 11 includes, as shown in FIGS. 5 and 6, a transmission line 12 disposed on the top surface of a fixture board 11c. The transmission line 12 includes a strip-shaped signal line 12a disposed continuously in the longitudinal direction and ground conductors 12b having the signal conductor 12a therebetween in the width direction, with a space therebetween. The signal conductor 12a and the ground conductors 12b are disposed on the same plane. Connectors 11a and 11b are provided at first and second ends of the measuring fixture 11. The connectors are connected to coaxial cables 14 and to measurement ports 21 to 23 of a network analyzer 20, which is an example of a measuring device. Signal lines 14a of the coaxial cables 14 are fixed by soldering, welding, or the like to the signal conductor 12a in order to eliminate connection variations. The measurement ports 21 and 23 are connected via the coaxial cables 14 to two ends of the signal conductor 12a, and the measurement port 22 is connected to the ground conductors 12b.

As shown in FIG. 6, a pusher 15 for pressing the short standard 10 against the transmission line 12 and a mechanism 16 for allowing the pusher 15 to freely move along the transmission line 12 are provided above the measuring fixture 11. A knife-edge-shaped conductor fixed to the tip of the insulating pusher 15 is used as the short standard 10.

When it is only necessary to measure scattering parameters with reference to the characteristic impedance of the transmission line, the characteristic impedance of the transmission line need not be known. However, in order to measure the impedance or the like, it is necessary that the characteristic impedance of the transmission line be known. This is implemented by a known method, such as calculations using a simulation or by using a value actually measured with a time domain reflectory method, for example.

As shown in FIG. 5, the short standard 10 is measured at three or more points on the transmission line 12 disposed on the measuring fixture 11. In this example, calibration performed on the side of a port 1 (connector 11a) will be described. However, the same operation needs to be done on the side of a port 2 (connector 11b). Actually, both ports are calibrated at the same time, thereby rationally avoiding overlapping redundant measurements.

Connection and Measurement of Short Standard

The short standard 10 is shunt-connected to a point at which a test object is to be measured (measurement point 1 in FIG. 5: P1) to short the signal conductor 12a and the ground conductors 12b, and thereafter a measurement is made, where $S_{11M1}$ is the measured reflection parameter. Let $\Gamma_{A1}$ be a true value of the reflection parameter at the measurement point 1. $\Gamma_{A1}$ is a true value of the reflection parameter of the short standard 10. When the size of the short standard 10 in the longitudinal direction of the transmission line 12 is sufficiently smaller than the wavelength of a measured signal, $\Gamma_{A1}$ is set to −1. Otherwise, an estimated value of the true value shall be obtained by a simulation or the like.

Next, the short standard 10 is shunt-connected to a position on the transmission line 12 distant from the measurement point 1 by a distance $L_1$ toward the port 1 (measurement point 2: P2), and thereafter a measurement is made, where $S_{11M2}$ is the measured reflection parameter. In this case, $\Gamma_{A2}$ is the true value of the reflection parameter of the short standard 10 at the measurement point 2. Letting the measurement point 1 be a reference plane, the true value $\Gamma_{A2}$ of the reflection parameter at the measurement point 2 is expressed, as shown in equation 1. Because an electromagnetic wave entering the port 1 is completely reflected by the short standard 10, the distance of the wave transmitted through the transmission line is shorter by 2 $L_1$ in a round trip than that in the case where the short standard 10 is connected to the test object measurement point. Here, α is the transmission degree [U/mm] of the transmission line per unit length, and β is a phase constant [rad/mm] of the transmission line:

$$\Gamma_{A2} = \Gamma_{A1} \alpha^{-2L_1} \exp(j2\beta L_1) \qquad [\text{Eq. 1}]$$

In equation 1, as is clear from the fact that the transmission degree α of the transmission line is expressed in terms of negative power, $\Gamma_{A2}$ exceeds one. In a normal sense, there is no short standard whose reflection parameter exceeds one. However, the above state is generated since the measurement point 1 serves as the reference plane in equation 1, and this is not abnormal.

Continuously, the short standard 10 is shunt-connected to a position on the transmission line 12 distant from the measurement point 1 by a distance $L_2$ toward the port 1 (measurement point 3: P3), and thereafter a measurement is made, where $S_{11M3}$ is the measurement result. As in the case of the measurement point 2, letting the measurement point 1 be the reference plane, the true value $\Gamma_{A3}$ of the reflection parameter at the measurement point 3 is expressed as shown in equation 2:

$$\Gamma_{A3}=\Gamma_{A1}\alpha^{-2L_2}\exp(j2\beta L_2) \quad [\text{Eq. 2}]$$

When the transmission line characteristics α and β are unknown, a further measurement is made by shunt-connecting the short standard 10 to a position on the transmission line distant from the measurement point 1 by a distance $L_3$ toward the port 1 (measurement point 4: P4), where $S_{11M4}$ is the measurement result. As in the case of the measurement point 2, let the measurement point 1 be the reference plane, the true value $\Gamma_{A4}$ of the reflection parameter at the measurement point 4 is expressed as shown in equation 3:

$$\Gamma_{A4}=\Gamma_{A1}\alpha^{-2L_3}\exp(j2\beta L_3) \quad [\text{Eq. 3}]$$

Here, as in the following equation, let ξ be an equation including α and β, where ξ physically represents a transmission parameter of the transmission line per unit length:

$$\xi=\alpha^{-2}\exp(j2\beta) \quad [\text{Eq. 4}]$$

Using equation 4, equations 1 to 3 can be rewritten as equations 5 to 7, respectively:

$$\Gamma_{A2}=\Gamma_{A1}\xi^{L_1} \quad [\text{Eq. 5}]$$

$$\Gamma_{A3}=\Gamma_{A1}\xi^{L_3} \quad [\text{Eq. 6}]$$

$$\Gamma_{A4}=\Gamma_{A1}\xi^{L_3} \quad [\text{Eq. 7}]$$

As has been described above, the measurement points 2 to 4 are located with respect to the test object measurement position (measurement point 1) only on the port 1 side. However, the measurement points 2 to 4 may be distributed to both sides (port 1 side and port 2 side) with the test object measurement position (measurement point 1) serving as the center. When the measurement points 2 to 4 are located on the port 2 side, the sign of the distance L is opposite of the sign on the port 1 side. In the case where the measurement points 2 to 4 are located on both sides, effective data can be obtained even when the transmission line 12 is short in length.

The measurement point 1 need not be the test object measurement position.

As a method for shunt-connecting the short standard 10, in FIG. 5, the short standard 10 is connected among the signal conductor 12a and the ground conductors 12b disposed on both sides. Alternatively, the short standard 10 may be connected between the signal conductor 12a and one ground conductor 12b.

Measurement in Through State

In addition to the measurement using the short standard 10, a measurement is made in a through state (a state where the ports are directly connected to each other). The "through state" means nothing is actually connected to the transmission line 12 serving as the measuring fixture, and a measurement is made. Measured values include a reflection parameter $S_{11MT}$ and a transmission parameter $S_{21MT}$.

Figure 1:
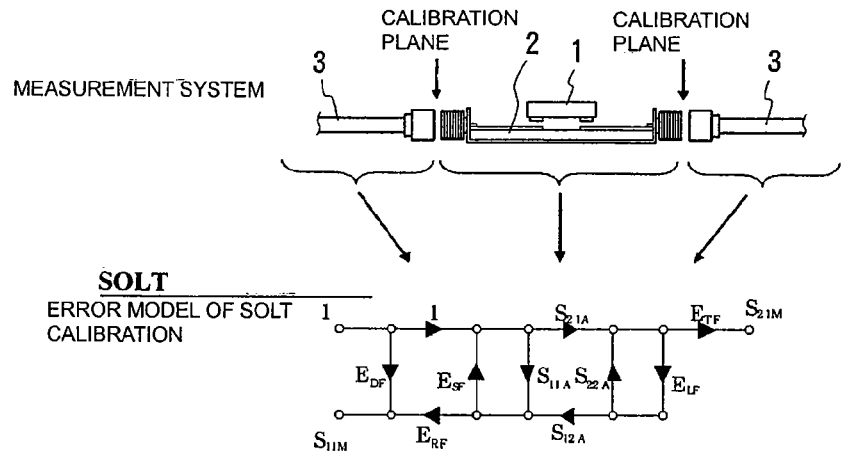
FIG. 1 is a diagram showing a measurement system using a network analyzer and an error model of SOLT calibration.
Figure 2:
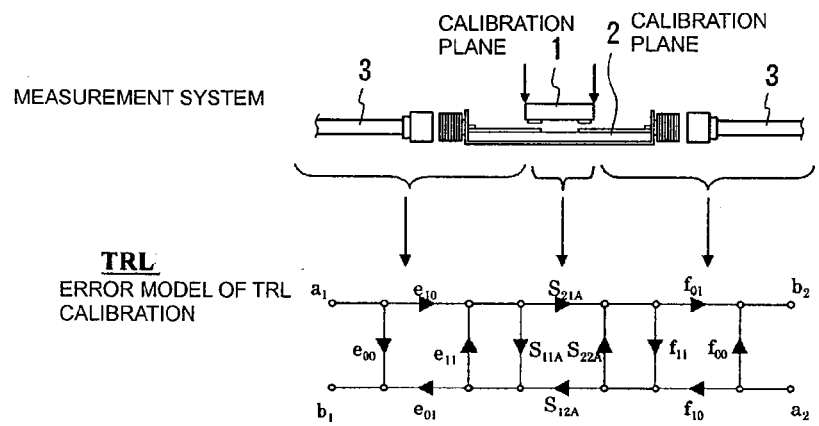
FIG. 2 is a diagram showing a measurement system using a network analyzer and an error model of TRL calibration.
Figure 3:
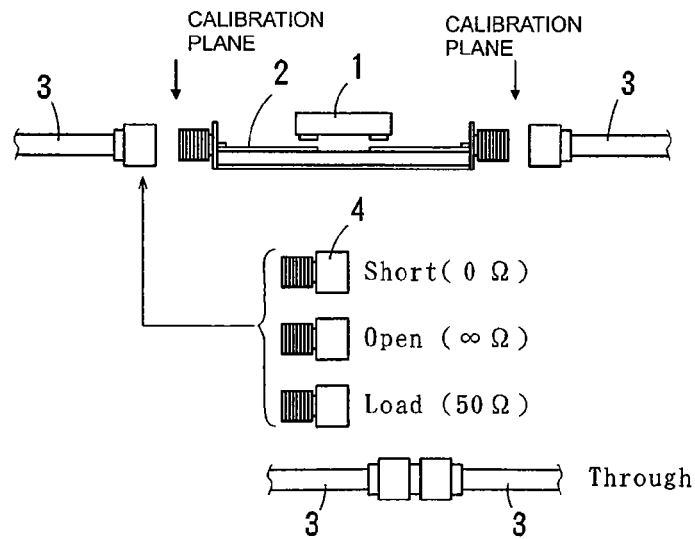
FIG. 3 is a diagram showing SOLT calibration.
Figure 4:
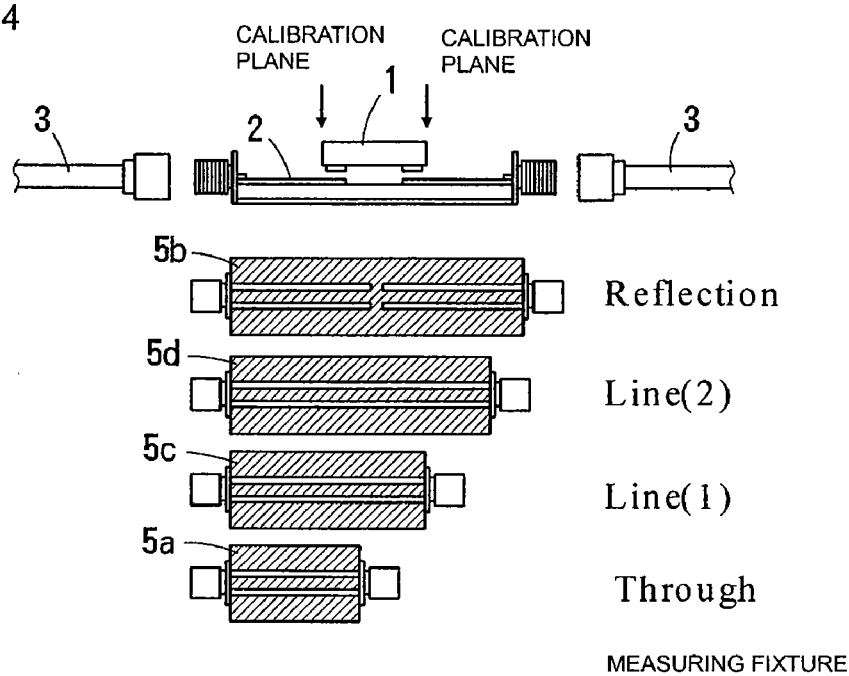
FIG. 4 is a diagram showing TRL calibration.
Figure 7:
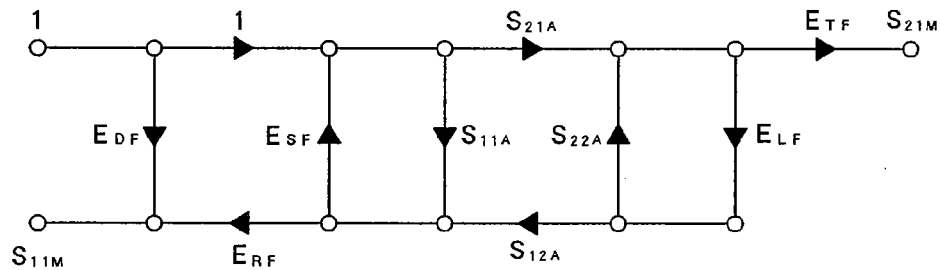
FIG. 7 is a diagram of an error model for use in the TRRR calibration according to the present invention.

FIG. 7 shows an error model of TRRR calibration. This is the same as an error model that has been used in SOLT calibration (FIG. 1). In the diagram, $S_{11M}$ and $S_{21M}$ are measured values of a reflection parameter and a transmission parameter, respectively, and $S_{11A}$, $S_{21A}$, and the like are true values of scattering parameters of a test object.

If the transmission line characteristics ξ are known, unknown values are three error coefficients ($E_{DF}$, $E_{SF}$, and $E_{RF}$) in the 1-port measurement. Since three equations are yielded from the measured values ($S_{11MT}$, $S_{11M2}$, and $S_{11M3}$) of the reflection parameters obtained by shorting the transmission line 12 at three points, all the unknown values ($E_{DF}$, $E_{SF}$, and $E_{RF}$) can be obtained.

The error coefficients ($E_{LF}$ and $E_{TF}$) in the through state can be derived from the measured values ($S_{11MT}$ and $S_{21MT}$) of the reflection parameter and the transmission parameter in the ideal through state and the already-obtained error coefficients ($E_{DF}$, $E_{SF}$, and $E_{RF}$).

Accordingly, all the error coefficients ($E_{DF}$, $E_{SF}$, $E_{RF}$, $E_{LF}$, and $E_{TF}$) of a measurement system can be obtained. Using these error coefficients, the true values ($S_{11A}$ and $S_{21A}$) of the electrical characteristics of the test object can be obtained on the basis of the measured values ($S_{11M}$ and $S_{21M}$) of the test object.

In contrast, if the transmission line characteristics ξ are unknown, there are a total of four unknown values including the three error coefficients ($E_{DF}$, $E_{SF}$, and $E_{RF}$) in the 1-port measurement and the transmission line characteristics. In this case, the transmission line is shorted at four points using the short standard, and four equations can be yielded from measured values ($S_{11M1}$, $S_{11M2}$, $S_{11M3}$, and $S_{11M4}$) of reflection parameters at four points. Thus, all the unknown values ($E_{DF}$, $E_{SF}$, $E_{RF}$ and ξ) can be obtained.

The subsequent calculating method is similar to the case where the transmission characteristics ξ are known.

The transmission line characteristics ξ include two unknown values, namely, the transmission degree α and the phase constant β. Since the transmission line characteristics ξ are represented by a complex number in which a real number portion corresponds to the transmission degree α and an imaginary number portion corresponds to the phase constant β, the transmission line characteristics ξ can be obtained as one unknown value.

For the sake of the subsequent calculations, it is preferable that the positions $L_1$, $L_2$, and $L_3$ at which the short standard is measured satisfy one of the following relationships:

$L_1:L_2:L_3=1:2:3$ $L_1:L_2:L_3=1:2:4$

When the positions $L_1$, $L_2$, and $L_3$ satisfy one of the above relationships, the transmission line characteristics can be explicitly calculated using the following equations 8 and 9.

$$\xi=[[\{(S_{11M3}^2+(2S_{11M1}-4S_{1M2})S_{11M3}+4S_{11M1}S_{11M2}-3S_{11M1}^2)S_{11M4}^2$$

$$+((2S_{11M2}-4S_{11M1})S_{11M3}^2+(4S_{11M2}^2-4S_{11M1}S_{11M2}+4S_{11M1}^2)S_{11M3}$$

$$-4S_{11M1}S_{11M2}^2+2S_{11M1}^2S_{11M2})S_{11M4}+(4S_{11M1}S_{11M2}-3S_{11M2}^2)S_{11M3}^2$$

$$+(2S_{11M1}S_{11M2}^2-4S_{11M1}^2S_{11M2})S_{11M3}+S_{11M1}^2S_{11M2}^2\}^{1/2}$$

$$+(S_{11M3}-2S_{11M2}+S_{11M1})S_{11M4}+(S_{11M2}-2S_{11M1})S_{11M3}+S_{11M1}S_{11M2}]$$

$$/((2S_{11M2}-2S_{11M1})S_{11M4}+(2S_{11M1}-2S_{11M2})S_{11M3})]^{1/L1} \quad [8]$$

$$\xi=[[\{(S_{11M3}^2-2S_{11M2}S_{11M3}-S_{11M2}^2+8S_{11M1}S_{11M2}-4S_{11M1}^2)S_{11M4}^2$$

$$+(-2S_{11M1}S_{11M3}^2+(8S_{11M2}^2-12S_{11M1}S_{11M2}+8S_{11M1}^2)S_{11M3}$$

$$-2S_{11M1}S_{11M2}^2)S_{11M4}+(-4S_{11M2}^2+8S_{11M1}S_{11M2}-3S_{11M1}^2)S_{11M3}^2$$

$$-2S_{11M1}{}^2S_{11M2}S_{11M3}+S_{11M1}{}^2S_{11M2}{}^2\}^{1/2}+(S_{11M3}-S_{11M2})S_{11M4}$$

$$S_{11M1}S_{11M3}+S_{11M1}S_{11M2}]$$

$$/\{(2S_{11M2}-2S_{11M1})S_{11M4}+(2S_{11M1}-2S_{11M2})S_{11M3}\}]^{1/L1} \qquad [\text{Eq. 9}]$$

When the positions $L_1$, $L_2$, and $L_3$ do not satisfy either of the above relationships, the transmission line characteristics cannot be calculated using the following equations, and it is thus necessary to obtain the transmission line characteristics by iterative calculations or the like.

Derivation of Error Coefficients

A specific method for deriving the error coefficients in TRRR calibration will be described.

The error coefficients in the model shown in FIG. 7 are obtained on the basis of the results of measuring the short standard 10 in the above-described TRRR calibration. The procedure is as follows. First, the transmission line characteristics $\xi$ are obtained, and, using the obtained transmission characteristics $\xi$, $\Gamma_{A2}$ and the like are obtained, thereby obtaining $E_{DF}$, $E_{SF}$, $E_{RF}$, and the like.

When the positions $L_1$, $L_2$, and $L_3$ at which the short standard is measured satisfy the relationship $L_1:L_2:L_3=1:2:3$, $\xi$ can be obtained using equation 8:

$$\xi=[[\{(S_{11M3}{}^2+(2S_{11M1}-4S_{11M2})S_{11M3}+4S_{11M1}S_{11M2}-3S_{11M1}{}^2)S_{11M4}{}^2$$

$$+((2S_{11M2}-4S_{11M1})S_{11M3}{}^2+(4S_{11M2}{}^2-4S_{11M1}S_{11M2}+4S_{11M1}{}^2)S_{11M3}$$

$$-4S_{11M1}S_{11M2}{}^2+2S_{11M1}{}^2S_{11M2})S_{11M4}+(4S_{11M1}S_{11M2}-3S_{11M2}{}^2)S_{11M3}{}^2$$

$$+(2S_{11M1}S_{11M2}{}^2-4S_{11M1}{}^2S_{11M2})S_{11M3}+S_{11M1}{}^2S_{11M2}{}^2\}^{1/2}$$

$$+(S_{11M3}-2S_{11M2}+S_{11M1})S_{11M4}+(S_{11M2}-2S_{11M1})S_{11M3}+S_{11M1}S_{11M2}]$$

$$/((2S_{11M2}-2S_{11M1})S_{11M4}+(2S_{11M1}-2S_{11M1})S_{11M3})]^{1/L1} \qquad [\text{Eq. 8}]$$

In contrast, when the positions $L_1$, $L_2$, and $L_3$ satisfy the relationship $L_1:L_2:L_3=1:2:4$, $\xi$ can be obtained using equation 9:

$$\xi=[[\{(S_{11M3}{}^2-2S_{11M2}S_{11M3}-3S_{11M2}{}^2+8S_{11M1}S_{11M2}-4S_{11M1}{}^2)S_{11M4}{}^2$$

$$+(-2S_{11M1}S_{11M3}{}^2+(8S_{11M2}{}^2-12S_{11M1}S_{11M2}+8S_{11M1}{}^2)S_{11M3}$$

$$-2S_{11M1}S_{11M2}{}^2)S_{11M4}+(-4S_{11M2}+8S_{11M1}S_{11M2}-3S_{11M1}{}^2)S_{11M3}{}^2$$

$$-2S_{11M1}{}^2S_{11M2}S_{11M3}+S_{11M1}{}^2S_{11M2}{}^2\}^{1/2}+(S_{11M3}-S_{11M2})S_{11M4}$$

$$-S_{11M1}S_{11M3}+S_{11M1}S_{11M2}]$$

$$/\{(2S_{11M2}-2S_{11M1})S_{11M4}+(2S_{11M1}-2S_{11M2})S_{11M3}\}]^{1/L1} \qquad [\text{Eq. 9}]$$

When the ratio of $L_1:L_2:L_3$ does not satisfy either of the above conditions, an equation for obtaining $\xi$ is not explicitly derived. In such a case, a similar equation may be derived as needed, or $\xi$ may be obtained by iterative calculations.

When $\xi$ is obtained by equation 8 or 9, the values $\Gamma_{A2}$ and $\Gamma_{A3}$ can be calculated by equations 5 and 6. Thus, the error coefficients $E_{DF}$, $E_{SF}$, and $E_{RF}$ can be obtained using the following equation 10, where Denom is an intermediate variable:

$$D_{enom} = \Gamma_{A2}\Gamma_{A3}S_{11M3} - \Gamma_{A1}\Gamma_{A3}S_{11M3} - \Gamma_{A2}\Gamma_{A3}S_{11M2} + \qquad [\text{Eq. 10}]$$

$$\Gamma_{A1}\Gamma_{A2}S_{11M2} + \Gamma_{A1}\Gamma_{A3}S_{11M1} - \Gamma_{A1}\Gamma_{A2}S_{11M1}$$

$$E_{DF} = -(\Gamma_{A1}\Gamma_{A3}S_{11M2}S_{11M3} - \Gamma_{A1}\Gamma_{A2}S_{11M2}S_{11M3} -$$

$$\Gamma_{A2}\Gamma_{A3}S_{11M1}S_{11M3} + \Gamma_{A1}\Gamma_{A2}S_{11M1}S_{11M3} +$$

$$\Gamma_{A2}\Gamma_{A3}S_{11M1}S_{11M2} - \Gamma_{A1}\Gamma_{A3}S_{11M1}S_{11M2})/D_{enom}$$

$$E_{RF} = \frac{(\Gamma_{A2}-\Gamma_{A1})(\Gamma_{A3}-\Gamma_{A1})(\Gamma_{A3}-\Gamma_{A2})(S_{11M2}-S_{11M1})}{D_{enom}^2}$$

$$E_{SF} = \frac{\Gamma_{A2}S_{11M3} - \Gamma_{A1}S_{11M3} - \Gamma_{A3}S_{11M2} + \Gamma_{A1}S_{11M2} + \Gamma_{A3}S_{11M1} - \Gamma_{A2}S_{11M1}}{D_{enom}}$$

Next, $E_{LF}$ and $E_{TF}$ can be obtained using the measurement results $S_{11MT}$ and $S_{21MT}$ in the ideal through state using equation 11:

$$E_{LF} = \frac{S_{11MT} - E_{DF}}{E_{RF} + E_{SF}S_{11MT} - E_{DF}E_{SF}} \qquad [\text{Eq. 11}]$$

$$E_{TF} = S_{21MT}(1 - E_{SF}E_{LF})$$

The above discussion is based on the case where a signal is applied from the port 1 to the port 2 (forward direction). The same applies to the case of the reverse direction.

In the case where the test object measurement position is moved on the transmission line by L toward the port 1, a state where a scattering parameter matrix expressed by expression 12 is connected to the port 1 side of the error model of the TRRR calibration is obtained, and a state where a scattering parameter matrix expressed by expression 13 is connected to the port 2 side thereof, thereby generating new error coefficients of the TRRR calibration. In this way, the correct results can be obtained without making additional calibration measurements. Since the transmission line characteristics $\xi$ are known, it is possible to estimate changes in the error coefficients when the length of the transmission line on each port side changes by L.

$$\begin{pmatrix} 0 & \alpha^{-L}\exp(j\beta L) \\ \alpha^{-L}\exp(-j\beta L) & 0 \end{pmatrix} \qquad [\text{Ex. 12}]$$

$$\begin{pmatrix} 0 & \alpha^{L}\exp(-j\beta L) \\ \alpha^{L}\exp(-j\beta L) & 0 \end{pmatrix} \qquad [\text{Ex. 13}]$$

Using the above, when the transmission line at the test object measurement position is worn out by numerous measurements, the test object measurement position is appropriately shifted to an unworn portion of the transmission line, where further measurements can be made. As a result, the lifetime of the fixture can be extended. In this case, it is unnecessary to redo calibration, and it is only necessary to mathematically correct the error factors of the measurement system.

Measurement of Test Object and TRRR Calibration

Figure 8:
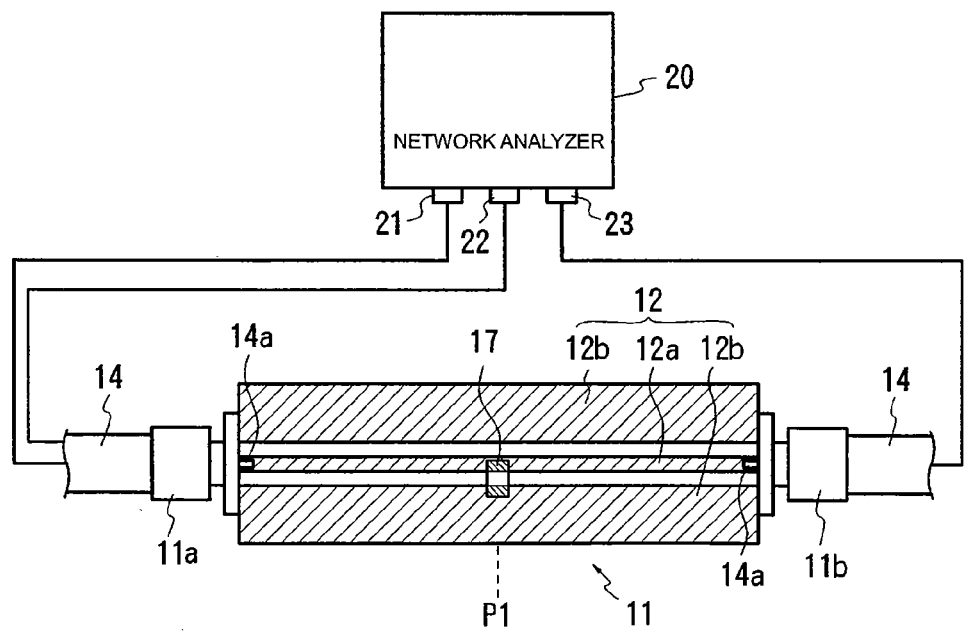
FIG. 8 is a plan view of the high-frequency electrical characteristic measuring apparatus according to the example, which is measuring a test object.

Referring now to FIG. 8, when the error coefficients have been obtained, a two-terminal electronic device (a surface-mounted device in this case) 17 serving as a test object is connected between the signal conductor 12a and the ground conductor 12b, and electrical characteristics of the test object 17 are measured. For example, the test object 17 is picked up using a chip mounter or the like, the test object 17 is shunt-connected to the test object measurement position P1 of the measuring fixture 11, and the reflection parameters and the transmission parameters ($S_{11M}$, $S_{21M}$, $S_{12M}$, and $S_{22M}$) of the test object in the forward direction and the reverse direction are measured. The transmission line 12 used here is the same as that used in the previous calibration, and the connections between the transmission line 12 and the coaxial cables 14 remain fixed.

Since the error model of TRRR calibration is the same as that of SOLT calibration, the effects of errors can be removed from the actual results of measuring the test object by performing calculations similar to those in SOLT calibration. Equations for removing the effects of errors and obtaining scattering parameters $S_{11A}$ and $S_{21A}$ of the test object are given below. The equations for removing the effects of errors are not limited to the equations given below, and any known technique may be used.

$$S_{11A} = \frac{\frac{S_{11M}-E_{DF}}{E_{RF}}\left(\frac{E_{SR}(S_{22M}-E_{DR})}{E_{RR}}+1\right) - \frac{E_{LF}S_{12M}S_{21M}}{E_{TF}E_{TR}}}{\left(\frac{E_{SF}(S_{11M}-E_{DF})}{E_{RF}}+1\right)\left(\frac{E_{SR}(S_{22M}-E_{DR})}{E_{RR}}+1\right) - \frac{E_{LF}E_{LR}S_{12M}S_{21M}}{E_{TF}E_{TR}}} \quad \text{[Eq. 14]}$$

$$S_{21A} = \frac{\frac{S_{21M}}{E_{TF}}\left(\frac{(E_{SR}-E_{LF})(S_{22M}-E_{DR})}{E_{RR}}+1\right)}{\left(\frac{E_{SF}(S_{11M}-E_{DF})}{E_{RF}}+1\right)\left(\frac{E_{SR}(S_{22M}-E_{DR})}{E_{RR}}+1\right) - \frac{E_{LF}E_{LR}S_{12M}S_{21M}}{E_{TF}E_{TR}}}$$

An example of a TRRR calibration method will be described in accordance with the flowchart shown in FIG. 9.

First, a measuring device is connected via coaxial cables to a measuring fixture (step S1), and the reflection parameter $S_{11MT}$ and the transmission parameter $S_{21MT}$ in a through state are measured (step S2).

Next, the signal conductor and the ground conductors are shorted by the short standard at a first position (step S3). The first position may be the test object measurement position or another position. While the short standard is being connected, the reflection parameters ($S_{11M1}$ and $S_{22M1}$) on the port 1 side and the port 2 side are measured (step S4).

Next, the signal conductor and the ground conductors are shorted by the short standard at a second position (step S5), and the reflection parameters ($S_{11M2}$ and $S_{22M2}$) on the port 1 side and the port 2 side are measured (step S6). Next, the signal conductor and the ground conductors are shorted by the short standard at a third position (step S7), and the reflection parameters ($S_{11M3}$ and $S_{22M3}$) on the port 1 side and the port 2 side are measured (step S8).

If the transmission line characteristics ξ are unknown, the signal conductor and the ground conductor are again shorted by the short standard at a fourth position (step S9), and the reflection parameters ($S_{11M4}$ and $S_{22M4}$) on the port 1 side and the port 2 side are measured (step S10). Using equation 8 or 9, the transmission line characteristics ξ are calculated (step S11). When the transmission line characteristics ξ are known, steps S9 to S11 may be omitted.

Thereafter, the error coefficients are calculated using the measured reflection parameters and transmission line characteristics ξ and using equations 10 and 11 (step S12).

After the error coefficients have been calculated, the test object is connected to the measuring fixture (step S13), and the reflection parameters and the transmission parameters ($S_{11M}$, $S_{21M}$, $S_{12M}$, and $S_{22M}$) of the test object in the forward and reverse directions are measured (step S14). Next, the effects of errors are removed using equations 14 (step S15), and the error-removed results (true values of the test object) are displayed on a display and the test object is selected (step S16). Thereafter, steps S13 to S16 are repeated until the measurement of all the test objects is completed (step S17). When the measurement of all the test objects is completed, the TRRR calibration ends.

When there is poor contact between the short standard and the transmission line upon shunt-connecting the short standard, wrong reflection parameters are measured. To detect poor contact, it is preferable to measure transmission parameters. That is, when the short standard is in proper contact with the transmission line, total reflection occurs. Hence, the transmission parameters between the ports of the fixture are very small. However, when there is poor contact between the short standard and the transmission line, the transmission parameters between the ports become large. Using a transmission parameter difference, poor contact can be easily detected. Since a measurement error can be detected during the calibration procedure, it is possible to avoid a waste of time, such as a calibration failure recognized subsequently upon the measurement of the test object.

Figure 9:
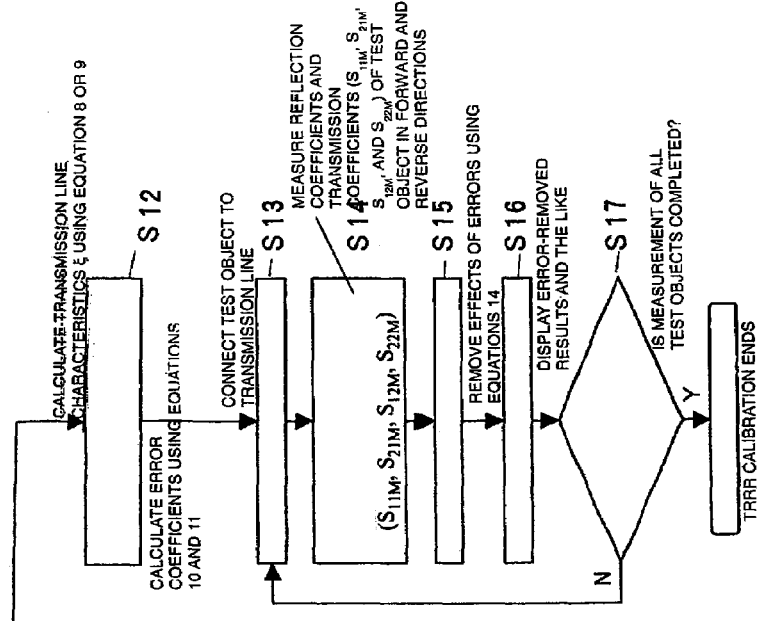
FIG. 9 is a flowchart of an example of a calibration method according to the present invention.
Figure 9:
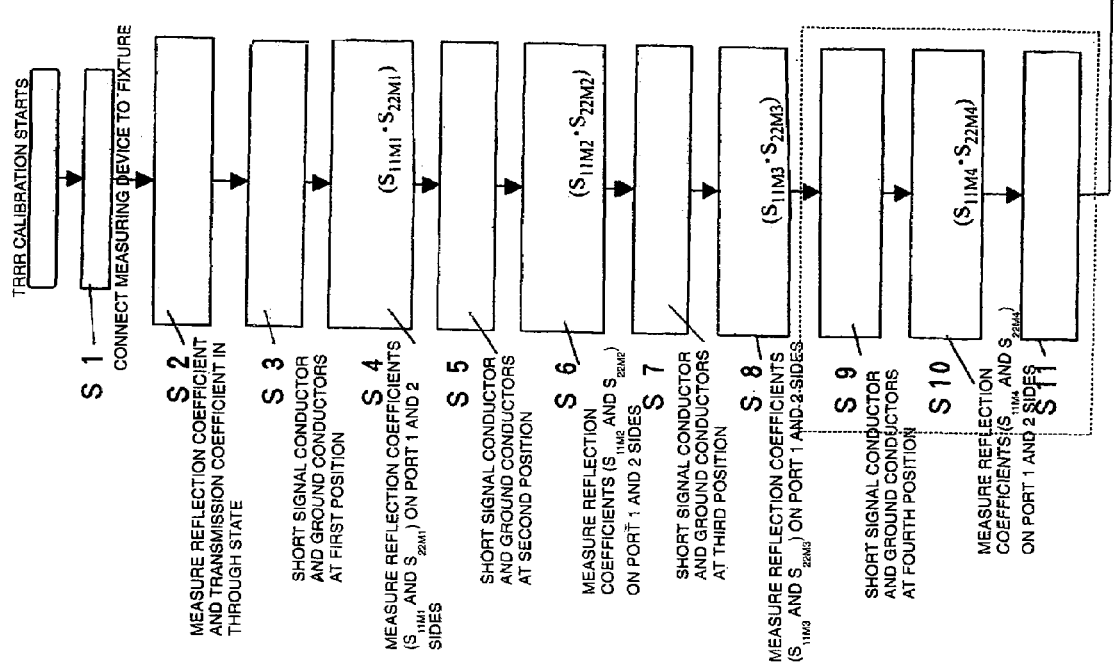
Figure 10:
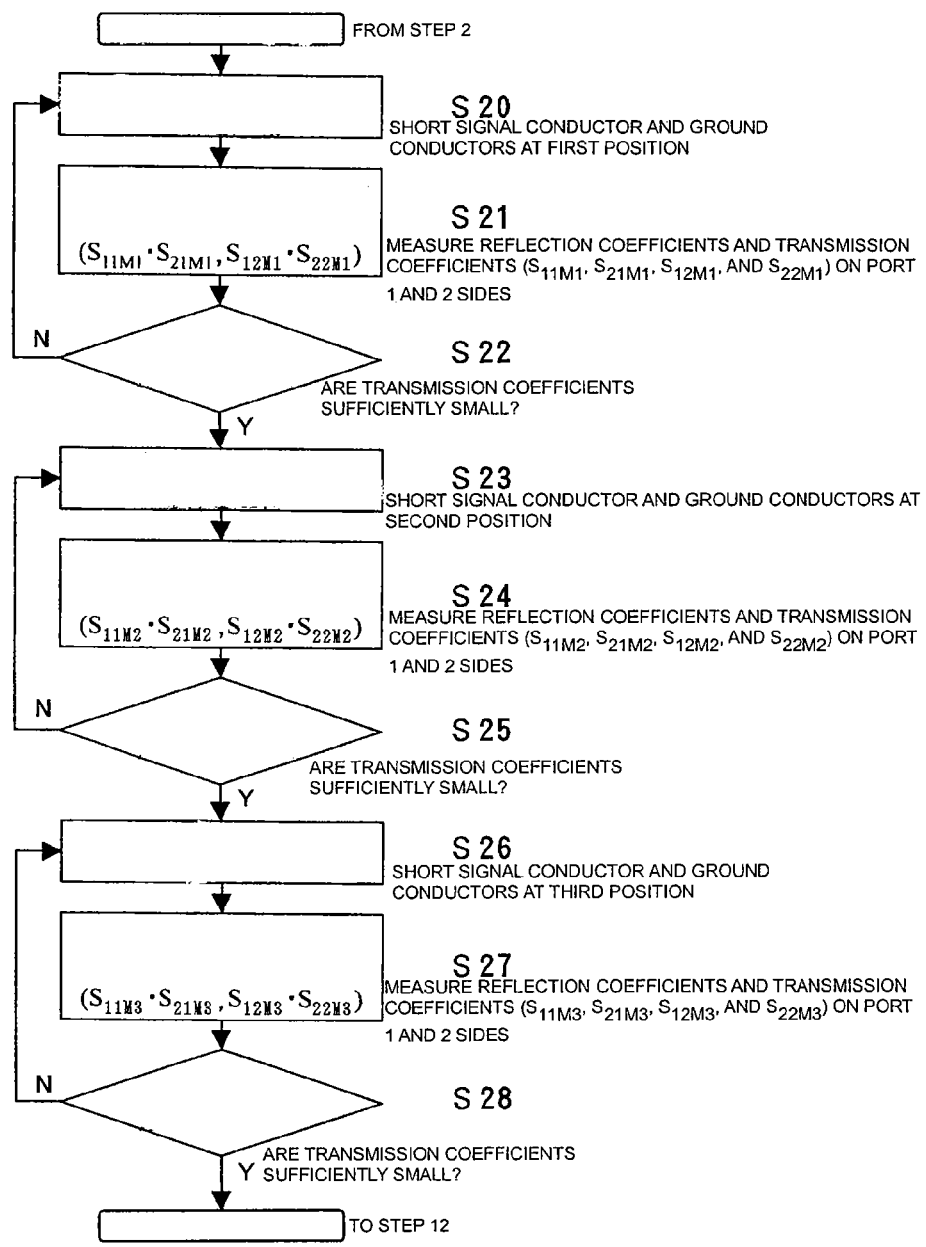
FIG. 10 is a flowchart of another example of the calibration method according to the present invention.

FIG. 10 is a flowchart of an additional process of detecting poor contact on the basis of the transmission parameters, which may be added to the process of deriving the error coefficients shown in FIG. 9.

First, the signal conductor and the ground conductors are shorted by the short standard at the first position (step S20). While the short standard is being connected, not only the reflection parameters ($S_{11M1}$ and $S_{22M1}$) on the port 1 side and the port 2 side, but also the transmission parameters ($S_{12M1}$ and $S_{21M1}$) are measured (step S21). It is determined whether the measured transmission parameters are sufficiently small (step S22). If the transmission parameters are not sufficiently small, it is determined that there is poor contact, and steps S20 and S21 are again repeated. In contrast, if the transmission parameters are sufficiently small, it is determined that the contact is satisfactory, and a measurement is made at the second position.

Similarly, the signal conductor and the ground conductors are shorted by the short standard at the second position (step S23), and the reflection parameters ($S_{11M2}$ and $S_{22M2}$) and the transmission parameters ($S_{12M2}$ and $S_{21M2}$) on the port 1 side and the port 2 side are measured (step S24). It is determined whether the measured transmission parameters are sufficiently small (step S25). If the transmission parameters are not sufficiently small, it is determined that there is poor contact, and steps S23 and S24 are again repeated. In contrast, if the transmission parameters are sufficiently small, it is determined that the contact is satisfactory, and a measurement is made at the third position.

Similarly, the signal conductor and the ground conductors are shorted by the short standard at the third position (step S26), and the reflection parameters ($S_{11M3}$ and $S_{22M3}$) and the transmission parameters ($S_{12M3}$ and $S_{21M3}$) on the port 1 side and the port 2 side are measured (step S27). It is determined whether the measured transmission parameters are sufficiently small (step S28). If the transmission parameters are not sufficiently small, it is determined that there is poor contact, and steps S26 and S27 are again repeated. In contrast, if the transmission parameters are sufficiently small, it is determined that the contact is satisfactory.

In this example, no measurement of the short standard at the fourth position is made. If the transmission line characteristics are unknown, a similar measurement and determination may be performed at the fourth position.

Thereafter, the flow proceeds to step S12 of FIG. 9, and the error coefficients are derived and corrected.

In FIG. 10, both the transmission parameters on the port 1 side and the port 2 side are measured to detect poor contact. However, when the transmission parameters of the measurement system have no directivity, poor contact can be detected by the transmission parameter on the side of only one port.

Figure 11:
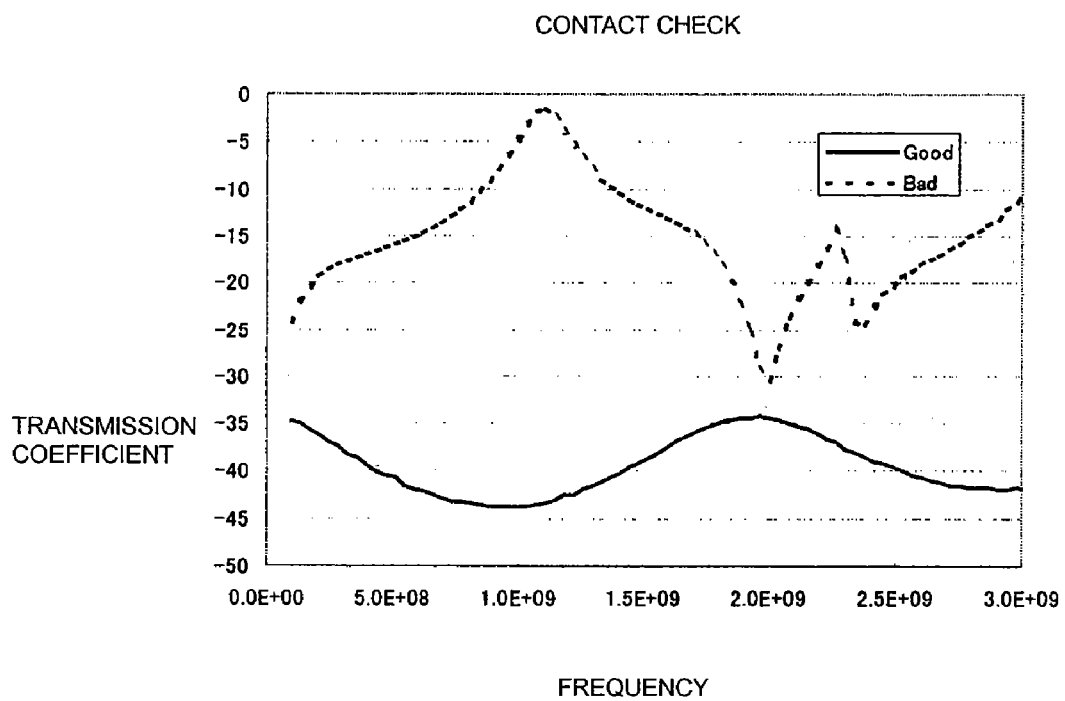
FIG. 11 is a characteristic diagram showing transmission parameters i with satisfactory contact and poor contact of a short standard.

FIG. 11 shows examples of transmission parameters in the (Good) case where the short standard is satisfactorily connected and the (Bad) case where there is poor contact.

In the measurement of the short standard in the calibration procedure, total reflection occurs when the short standard is in proper contact with the transmission line. Hence, the transmission parameters between the ports of the fixture are very small. However, if there is poor contact due to some reasons, the transmission parameters between the ports are increased. Using a transmission parameter difference, a measurement error in the calibration procedure can be detected. It is thus possible to avoid a waste of time, such as a calibration failure recognized subsequently upon the measurement of the test object.

A description will be given of the manner in which the positions at which the short standard 10 is measured are selected.

For example, it is assumed that the short standard 10 is measured at the test object measurement point on the transmission line 12 and at a point 5 mm away from the test object measurement point. If the transmission line 12 has low loss, the only difference between the measurement results at the two points is the phase. Let the wavelength be 30 mm (the wavelength of a 1-GHz electromagnetic wave in a vacuum), and a difference of 5 mm in position corresponds to a difference of 10 mm in position in a round trip. Thus, it is expected that the measured data has a phase difference of (10 mm÷30 mm)×360°=120°. However, let the wavelength be 10 mm (the wavelength of a 3-GHz electromagnetic wave in a vacuum), and the same difference of 10 mm in position in a round trip generates a phase difference of 10 mm÷10 mm×360°=360°, and hence there will be no phase difference. With a difference of 5 mm in position, calibration cannot be performed properly at the frequency of the 10-mm wavelength.

In order to perform highly accurate calibration, it is preferable that pieces of calibration data be apart from each other as far as possible. In the TRRR calibration where different pieces of calibration data are obtained depending on the reflection phase based on the short standard, it is preferable to adopt the condition where the phase difference between the positions at which the short standard is connected is between 70° and 145°.

The greater the phase difference between the calibration standards, the higher the accuracy of calibration. However, the frequency range that can be handled by a pair of calibration standards becomes narrow, and it thus becomes preferable to measure many calibration standards in order to perform broadband measurement. In the case of TRL calibration using the phase difference between calibration standards to perform calibration, as in the TRRR calibration, it is preferable to have a phase difference of 20° to 30° or greater between calibration standards in order to achieve a satisfactory measurement accuracy.

In contrast, when the phase difference between the positions at which the short standard is connected is between 70° and 145°, although the calibration accuracy becomes high, the frequency range that can be handled by a pair of calibration standards becomes very narrow, compared with the above case. However, as will be described below, when the setting of the positions at which the short standard is connected is very easy, and when the measured data in the calibration is put to full use, the number of times the short standard is measured is not greatly increased, even in the case of broadband measurement, which thereby presents no practical problem.

First, the second position at which the short standard is measured, at which the phase at the upper limit measurement frequency is about 145°, is obtained. Specifically, the second position is obtained using the following equation:

$$L = \frac{145\pi}{180\beta} \qquad [\text{Eq. 15}]$$

where $\beta$[rad/mm] is a phase constant, and L[mm] is a position at which the short standard is measured.

Next, the third position at which the short standard is measured is set to 2 L[mm], and the fourth position at which the short standard is measured is set to 4 L[mm]. Similarly, the n-th position at which the short standard is measured is set to $2^{n-2}$ L [mm]

In the frequency band from the upper limit measurement frequency $f_{max}$ to $f_{max}/2$, the RRRR calibration is performed using the results of measurements made at the first, second, and third positions at which the short standard is measured. In the frequency band from $f_{max}/2$ to $f_{max}/4$, the results of measurements made at the first, third, and fourth positions at which the short standard is measured are used. Similarly, in an n-th frequency band, namely, the frequency band from $f^{max}/2^{n-1}$ to $f_{max}/2^n$, the results of measurements made at the first, (n+1)-th, and (n+2)-th positions at which the short standard is measured are used. Accordingly, the phase difference between the positions at which the short standard is measured remains between 70° and 145°.

Figure 12:
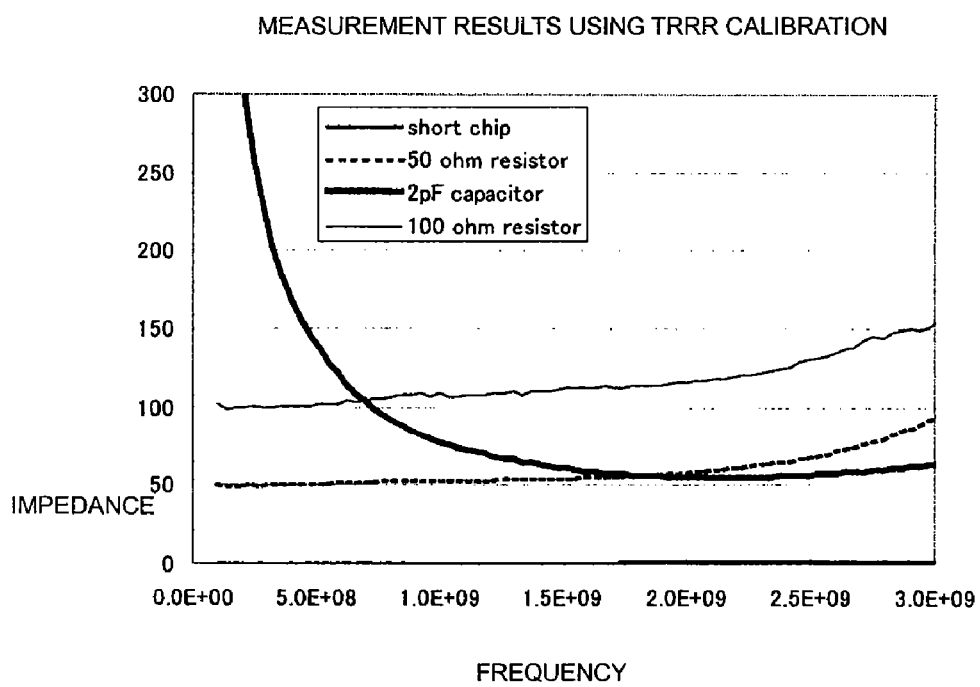
FIG. 12 is a diagram of high-frequency characteristics of the short standard, resistors, and a capacitor measured using the high-frequency electrical characteristic measuring apparatus according to example.

FIG. 12 shows the results of measuring, using the TRRR calibration, a few impedance devices in the range from 100 MHz to 3 GHz. The measured devices include the short standard (short chip), a 50-Ω resistor, a 2-pF capacitor, and a 100-Ω resistor.

The higher the frequency, the higher the impedances of the 50-Ω resistor and the 100-Ω resistor. This can be regarded as due to the residual inductances of the chip resistors.

At low frequencies, the impedance of the 2-pF capacitor decreases substantially in inverse proportion to the frequency. At frequencies equal to 2 GHz or higher, the impedance of the 2-pF capacitor increases. This can also be regarded as due to the residual inductance.

At any rate, it is clear from the results shown in FIG. 12 that the high-frequency characteristics of the test object are obtained with the TRRR calibration.

Figure 13:
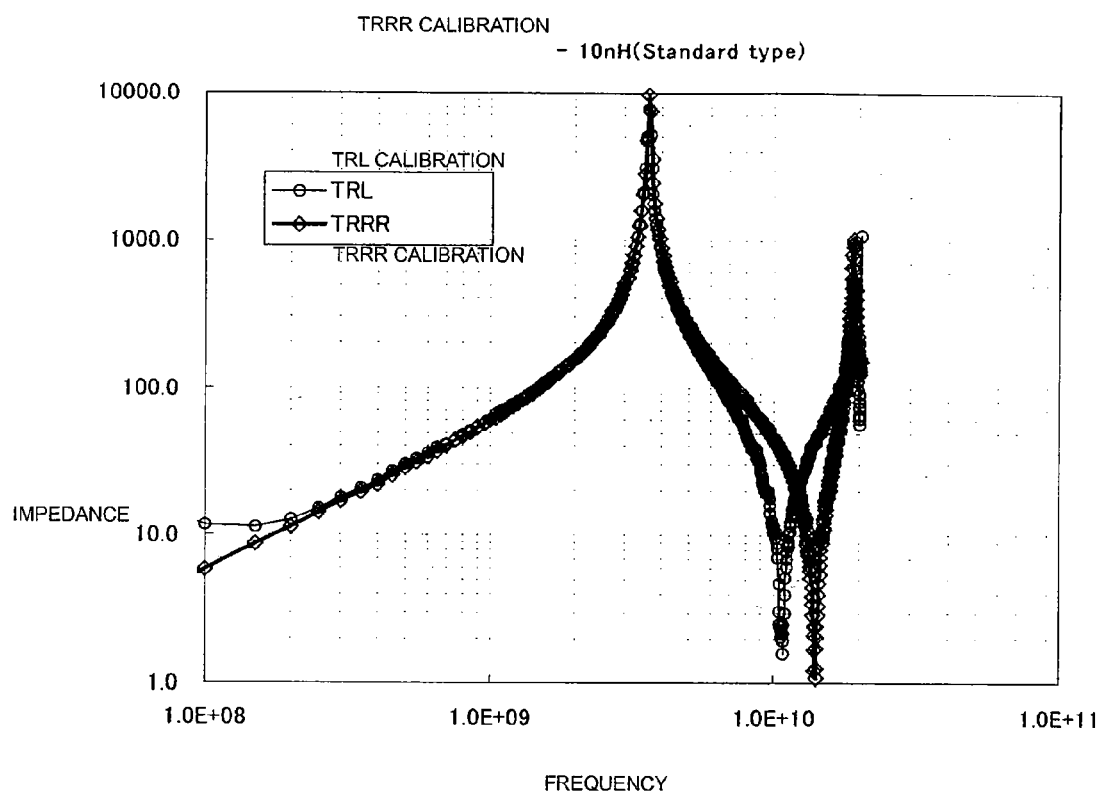
FIG. 13 is a diagram of high-frequency characteristics of an inductor measured using the high-frequency electrical characteristic measuring apparatus according to the example.

Using the TRRR calibration, a 10-nH chip inductor (laminated chip inductor) with a size of 1 mm×0.5 mm is measured within the range from 100 MHz to 20 GHz, the results of which are shown in FIG. 13 in comparison with the measurement results obtained with the known TRL calibration.

As is clear from FIG. 13, it can be understood that a general impedance characteristic curve of an inductor is obtained. That is, the impedance increases in proportion to an increase in frequency up to the self-resonance frequency, and, after the self-resonance frequency, the impedance decreases in inverse proportion to an increase in frequency. These results substantially trace those obtained in the measurement performed with the TRL calibration.

At about 10 GHz or higher, the measurement results obtained with the TRL calibration are different from those obtained with the TRRR calibration. This can be regarded as due to a slight difference in the position at which the test object is connected upon the measurement.

Embodiment 2

The measuring device is equipped with a computer and dedicated software. When the residual inductance of the calibration standard, parameters (phase constant β[rad/mm] and transmission loss β[dB/Hz]) of the transmission line, and the contact positions of the calibration standard are input, the computer is allowed to automatically calculate the calibration standard characteristics at each position on the basis of equations 1 to 3, make a measurement of the short standard at each position (through measurement if necessary), and automatically calculate error factors using the obtained data in calibration calculations using equations 10. In short, the network analyzer is enabled to automatically estimate the values of the calibration standard and perform TRRR calibration.

In this case, in a device inspection process performed at a mass production factory, an operator or the like need not calculate the values of the calibration standard, and the TRRR calibration can be performed with the measuring device alone. Thus, the process can be simplified.

Embodiment 3

The residual inductance of the short standard may have a large influence due to high frequencies, and, even when the short standard is shunt-connected to the transmission line, the transmission line may not be sufficiently shorted (signal passes from one port to the other and total reflection is not achieved).

Figure 14:
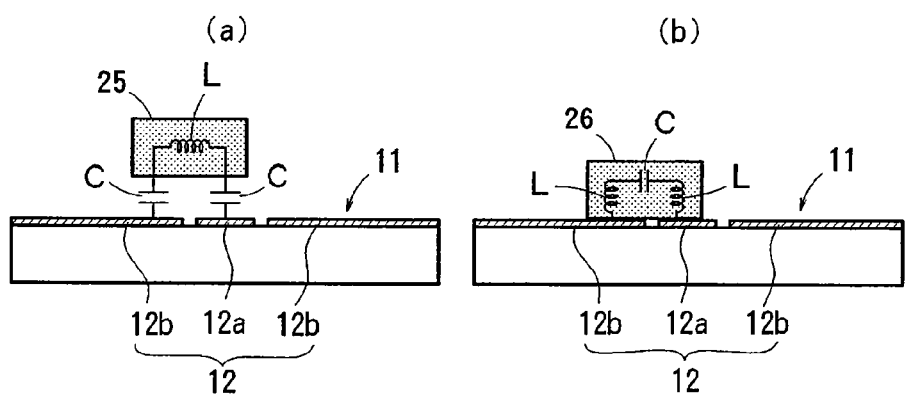
FIG. 14 includes views showing examples in which series resonance is produced between the calibration standard and a transmission line.

In this case, as shown in portion (a) of FIG. 14, it is preferable that a calibration standard 25 be placed in the vicinity of (not in contact with) the transmission line, and that the capacitance C(F) generated between the transmission line and the calibration standard and the residual inductance L(H) of the calibration standard be in a series resonance state. In this case, it is set to satisfy $C=1/(2\pi f \sqrt{L})$.

Instead of using the stray capacitance between the calibration standard and the transmission line, as shown in portion (b) of FIG. 14, a calibration standard 26 may be placed in contact with the transmission line, thereby producing series resonance. In this case, the calibration standard 26 may be a capacitor with a very small capacitance.

In the series resonance state, the impedance of a portion in contact with the calibration standard is 0Ω, that is, an ideal short-circuited state is achieved. In other words, even at high frequencies where a satisfactory short standard is not obtained, the same advantage as that of using a satisfactory short standard can be achieved.

Embodiment 4

Figure 15:
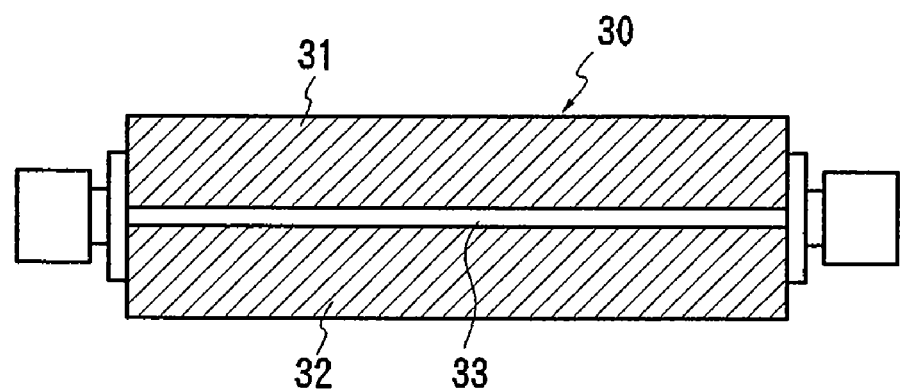
FIG. 15 is a plan view of a slot line serving as another example of the transmission line.

In the above embodiments, cases in which the coplanar waveguide is used as the transmission line have been described. Alternatively, as shown in FIG. 15, a slot line 30 may be used. The slot line 30 includes a signal conductor 31 and a ground conductor 32, which are disposed on the same plane with a space 33 therebetween. A calibration standard and a test object are shunt-connected between the signal conductor 31 and the ground conductor 32.

The high-frequency electrical characteristic measuring method according to the present invention is not limited to the above embodiments.

The transmission line is not limited to the planar transmission line. A transmission line with an arbitrary structure can be used as long as the transmission line includes a signal conductor and a ground conductor and has known electrical characteristics per unit length, and a calibration standard (e.g., short standard) and a test object can be shunt-connected thereto.

The 3-receiver network analyzer has been used as the measuring device in the above embodiments because the error model of SOLT calibration has been employed. When the error model of TRL calibration is employed, a 4-receiver network analyzer is used.

The measuring device is not limited to the network analyzer. Any device that can measure high-frequency electrical characteristics can be used.

As has been described above, a high-frequency electrical characteristic measuring method according to the present invention has the following advantages.

1) Since a transmission line for use in calibration is the same as a transmission line for use in measuring a test object, the method is less likely to be influenced by variations of the transmission line. Connections between the transmission line and a measuring device are fixed in calibration and in measurement, and there is no need to establish a reconnection. There will be no calibration failures or the like due to poor contact with the transmission line or the like.

2) In the case of poor contact when a short standard is connected to achieve a total reflection state, a signal passes from one measurement port to the other. Therefore, poor contact of the short standard can be readily detected. It is thus possible to avoid in advance a failure in the calibration operation.

3) A highly accurate measurement of high-frequency characteristics of a two-terminal electronic device alone can be made, without being influenced by errors of a fixture or the like. With a high-frequency electrical characteristic measuring apparatus, the present invention provides a method highly effective in accurately measuring the impedance, the Q-value, or the like of the two-terminal electronic device such as a chip inductor, a chip capacitor, or a chip resistor.

Although the present invention has been described in relation to particular embodiments thereof, many other variations and modifications and other uses will become apparent to those skilled in the art. Therefore, the present invention is not limited by the specific disclosure herein.

The invention claimed is:

1. A method for measuring high-frequency characteristics of an electronic device, the method comprising the steps of:
preparing a transmission line whose electrical characteristics per unit length are known, the transmission line including a signal conductor and a ground conductor;
connecting two ends of the transmission line to associated measurement ports of a measuring device;
measuring, at least three points in the longitudinal direction of the transmission line, electrical characteristics in a connection state where the signal conductor is connected to the ground conductor;

obtaining error factors of a measurement system including the transmission line on the basis of measured values in the connection state and the electrical characteristics of the transmission line;

shunt-connecting the electronic device to be measured to the transmission line and measuring electrical characteristics; and removing the error factors of the measurement system from measured values of the electronic device to be measured and thereby obtaining true values of the electrical characteristics of the electronic device to be measured.

2. A method for measuring high-frequency characteristics of an electronic device, the method comprising the steps of:

preparing a transmission line whose electrical characteristics per unit length are unknown, the transmission line including a signal conductor and a ground conductor;

connecting two ends of the transmission line to associated measurement ports of a measuring device;

measuring, at least four points in the longitudinal direction of the transmission line, electrical characteristics in a connection state where the signal conductor is connected to the ground conductor;

obtaining error factors of a measurement system including the transmission line and the electrical characteristics of the transmission line on the basis of measured values in the connection state;

shunt-connecting the electronic device to be measured to the transmission line and measuring electrical characteristics; and removing the error factors of the measurement system from measured values of the electronic device to be measured and thereby obtaining true values of the electrical characteristics of the electronic device to be measured.

3. The high-frequency electrical characteristic measuring method according to claim 1 or 2, wherein the step of measuring the electrical characteristic in the connection state where the signal conductor is connected to the ground conductor is includes the step of shunt-connecting a short standard and measuring electrical characteristics.

4. The high-frequency electrical characteristic measuring method according to claim 3, wherein the step of shunt-connecting the short standard and measuring the electrical characteristics includes the substep of measuring transmission parameters and detecting poor contact of the short standard on the basis of the measured transmission parameters.

5. The high-frequency electrical characteristic measuring method according to claim 1 or 2, wherein a calibration standard is brought into contact or near contact with the transmission line in order to connect the signal conductor to the ground conductor, and series resonance is produced between capacitance of the calibration standard or capacitance between the calibration standard and the transmission line and residual inductance of the calibration standard.

6. The high-frequency electrical characteristic measuring method according to any one of claim 1 or 2, wherein, in addition to the measured values in the connection state, measured values obtained in a through state of the transmission line are used to obtain the error factors of the measurement system.

7. The high-frequency electrical characteristic measuring method according to claim 6, wherein the step of obtaining the error factors of the measurement system including the transmission line is executed using the following equations:

$$D_{enom} = \Gamma_{A2}\Gamma_{A3}S_{11M3} - \Gamma_{A1}\Gamma_{A3}S_{11M3} - \Gamma_{A2}\Gamma_{A3}S_{11M2} + \Gamma_{A1}\Gamma_{A2}S_{11M2} + \Gamma_{A1}\Gamma_{A3}S_{11M1} - \Gamma_{A1}\Gamma_{A2}S_{11M1}$$ [Eq. 10]

$$E_{DF} = -(\Gamma_{A1}\Gamma_{A3}S_{11M2}S_{11M3} - \Gamma_{A1}\Gamma_{A2}S_{11M2}S_{11M3} - \Gamma_{A2}\Gamma_{A3}S_{11M1}S_{11M3} + \Gamma_{A1}\Gamma_{A2}S_{11M1}S_{11M3} + \Gamma_{A2}\Gamma_{A3}S_{11M1}S_{11M2} - \Gamma_{A1}\Gamma_{A3}S_{11M1}S_{11M2})/D_{enom}$$

$$E_{RF} = \frac{(\Gamma_{A2} - \Gamma_{A1})(\Gamma_{A3} - \Gamma_{A1})(\Gamma_{A3} - \Gamma_{A2})(S_{11M2} - S_{11M1})(S_{11M3} - S_{11M1})(S_{11M3} - S_{11M2})}{D_{enom}^2}$$

$$E_{SF} = \frac{\Gamma_{A2}S_{11M3} - \Gamma_{A1}S_{11M3} - \Gamma_{A3}S_{11M2} + \Gamma_{A1}S_{11M2} + \Gamma_{A3}S_{11M1} - \Gamma_{A2}S_{11M1}}{D_{enom}}$$

$$E_{LF} = \frac{S_{11MT} - E_{DF}}{E_{RF} + E_{SF}S_{11MT} - E_{DF}E_{SF}}$$ [Eq. 11]

$$E_{TF} = S_{21MT}(1 - E_{SF}E_{LF})$$

where $\Gamma_{A1}$ is a reflection parameter at a first measurement position, $\Gamma_{A2}$ is a reflection parameter at a second measurement position, $\Gamma_{A3}$ is a reflection parameter at a third measurement position, $S_{11M1}$ is a measured value at the first measurement position, $S_{11M2}$ is a measured value at the second measurement position, $S_{11M3}$ is a measured value at the third measurement position, $S_{11MT}$ is a reflection parameter in the through state, $S_{21MT}$ is a transmission parameter in the through state, and $E_{DF}$, $E_{RF}$, $E_{SF}$, $E_{LF}$, and $E_{TF}$ are the error factors of the measurement system.

8. The high-frequency electrical characteristic measuring method according to claim 7, wherein the step of removing the error factors of the measurement system from the measured values of the electronic device to be measured is executed using the following equations:

$$S_{11A} = \frac{\frac{S_{11M} - E_{DF}}{E_{RF}}\left(\frac{E_{SR}(S_{22M} - E_{DR})}{E_{RR}} + 1\right) - \frac{E_{LF}S_{12M}S_{21M}}{E_{TF}E_{TR}}}{\left(\frac{E_{SF}(S_{11M} - E_{DF})}{E_{RF}} + 1\right)\left(\frac{E_{SR}(S_{22M} - E_{DR})}{E_{RR}} + 1\right) - \frac{E_{LF}E_{LR}S_{12M}S_{21M}}{E_{TF}E_{TR}}}$$ [Eq. 14]

$$S_{21A} = \frac{\frac{S_{21M}}{E_{TF}}\left(\frac{(E_{SR} - E_{LF})(S_{22M} - E_{DR})}{E_{RR}} + 1\right)}{\left(\frac{E_{SF}(S_{11M} - E_{DF})}{E_{RF}} + 1\right)\left(\frac{E_{SR}(S_{22M} - E_{DR})}{E_{RR}} + 1\right) - \frac{E_{LF}E_{LR}S_{12M}S_{21M}}{E_{TF}E_{TR}}}$$

where $S_{11A}$ is a reflection parameter of the electronic device to be measured, and $S_{21A}$ is a transmission parameter of the electronic device to be measured.

9. The high-frequency electrical characteristic measuring method according to claim 1 or 2, wherein the transmission line includes the signal conductor and the ground conductor disposed on the same plane.

10. The high-frequency electrical characteristic measuring method according to claim 9, wherein the transmission line is a coplanar waveguide including the signal conductor and the ground conductors having the signal conductor therebetween.

11. The high-frequency electrical characteristic measuring method according to claim 9, wherein the transmission line is a slot line including the signal conductor and the ground conductor disposed with a space therebetween.

12. The high-frequency electrical characteristic measuring method according to claim 1 or 2, wherein each position at which the electrical characteristics are measured in the connection state is a position at which a phase difference between the measurement positions is between 70° and 145°.

13. An apparatus for measuring high-frequency characteristics of an electronic device, the apparatus comprising:
a transmission line whose electrical characteristics per unit length are known, the transmission line including a signal conductor and a ground conductor;
a measuring device that can measure high-frequency electrical characteristics, the measuring device including measurement ports connected to two ends of the signal conductor of the transmission line and a measurement port connected to the ground conductor;
means for establishing a connection state where the signal conductor is connected to the ground conductor at least three points on the transmission line;
means for obtaining error factors of a measurement system including the transmission line on the basis of measured values obtained by the measuring device in the connection state and the electrical characteristics of the transmission line;
means for shunt-connecting the electronic device to be measured to the transmission line; and
means for removing the error factors of the measurement system from measured values obtained by the measuring device by shunt-connecting the electronic device to be measured to the transmission line and obtaining true values of the electrical characteristics of the electronic device to be measured.

14. An apparatus for measuring high-frequency characteristics of an electronic device, the apparatus comprising:
a transmission line whose electrical characteristics per unit length are unknown, the transmission line including a signal conductor and a ground conductor;
a measuring device that can measure high-frequency electrical characteristics, the measuring device including measurement ports connected to two ends of the signal conductor of the transmission line and a measurement port connected to the ground conductor;
means for establishing a connection state where the signal conductor is connected to the ground conductor at least four points on the transmission line;
means for obtaining error factors of a measurement system including the transmission line and the electrical characteristics of the transmission line on the basis of measured values obtained by the measuring device in the connection state;
means for shunt-connecting the electronic device to be measured to the transmission line; and
means for removing the error factors of the measurement system from measured values obtained by the measuring device by shunt-connecting the electronic device to be measured to the transmission line and obtaining true values of the electrical characteristics of the electronic device to be measured.

15. The high-frequency electrical characteristic measuring apparatus according to claim 13 or 14, wherein the means for establishing the connection state includes a shorted short standard whose electrical characteristics are known and means for shunt-connecting the short standard to the transmission line.

16. The high-frequency electrical characteristic measuring apparatus according to claim 15, wherein measured values obtained by shunt-connecting the short standard include reflection parameters and transmission parameters, the apparatus further comprising means for detecting poor contact of the short standard by comparing each of the transmission parameters with a predetermined value.

17. A method for calibrating an apparatus for measuring high-frequency electrical characteristics of an electronic device, the method comprising the steps of:
preparing a high-frequency electrical characteristic measuring apparatus including a transmission line whose electrical characteristics per unit length are known, the transmission line including a signal conductor and a ground conductor, and both ends of the transmission line being connected to associated measurement ports of a measuring device;
measuring, at least three points in the longitudinal direction of the transmission line, electrical characteristics in a connection state where the signal conductor is connected to the ground conductor; and
obtaining error factors of a measurement system including the transmission line on the basis of measured values in the connection state and the electrical characteristics of the transmission line.

18. A method for calibrating an apparatus for measuring high-frequency electrical characteristics of an electronic device, the method comprising the steps of:
preparing a high-frequency electrical characteristic measuring apparatus including a transmission line whose electrical characteristics per unit length are unknown, the transmission line including a signal conductor and a ground conductor, and both ends of the transmission line being connected to associated measurement ports of a measuring device;
measuring, at least four points in the longitudinal direction of the transmission line, electrical characteristics in a connection state where the signal conductor is connected to the ground conductor; and
obtaining error factors of a measurement system including the transmission line and the electrical characteristics of the transmission line on the basis of measured values in the connection state.

19. In combination, an electronic device whose high-frequency electrical characteristics are to be measured said electronic device being shunt-connected to a measuring apparatus as set forth in claim 15 or 16.

* * * * *